United States Patent
Chih et al.

(10) Patent No.: US 7,053,647 B2
(45) Date of Patent: May 30, 2006

(54) METHOD OF DETECTING POTENTIAL BRIDGING EFFECTS BETWEEN CONDUCTING LINES IN AN INTEGRATED CIRCUIT

(75) Inventors: Yue-Der Chih, Hsin-Chu (TW); Ping-Chun Tai, Baoshan, Hsin Chu (TW)

(73) Assignee: Taiwan Semiconductor Manufacturing Co., Ltd. (TW)

(*) Notice: Subject to any disclaimer, the term of this patent is extended or adjusted under 35 U.S.C. 154(b) by 22 days.

(21) Appl. No.: 10/841,083

(22) Filed: May 7, 2004

(65) Prior Publication Data

US 2005/0248352 A1   Nov. 10, 2005

(51) Int. Cl.
*G11C 29/00* (2006.01)
*G01R 31/00* (2006.01)

(52) U.S. Cl. .................. 324/765; 324/719; 324/158.1; 365/201

(58) Field of Classification Search .................. None
See application file for complete search history.

(56) References Cited

U.S. PATENT DOCUMENTS

| | | | | |
|---|---|---|---|---|
| 3,727,039 A | * | 4/1973 | Baker et al. | 714/719 |
| 3,757,145 A | * | 9/1973 | Adam et al. | 327/541 |
| 4,393,475 A | * | 7/1983 | Kitagawa et al. | 365/185.21 |
| 4,404,657 A | * | 9/1983 | Furuyama et al. | 365/154 |
| 5,315,547 A | * | 5/1994 | Shoji et al. | 365/185.12 |
| 5,331,594 A | * | 7/1994 | Hotta | 365/201 |
| 6,198,612 B1 | * | 3/2001 | Manner | 361/86 |
| 6,272,044 B1 | * | 8/2001 | Yamamoto et al. | 365/185.17 |
| 6,375,714 B1 | * | 4/2002 | Rump et al. | 95/3 |
| 6,456,098 B1 | * | 9/2002 | Pochmuller | 324/719 |

FOREIGN PATENT DOCUMENTS

JP   11039887 A   * 2/1999

* cited by examiner

*Primary Examiner*—Paresh Patel
(74) *Attorney, Agent, or Firm*—Duane Morris LLP

(57) ABSTRACT

A method and system for detecting a potential reliability problem cause by electrical bridging in an integrated circuit. A voltage difference is created between two conducting lines in the integrated circuit to accelerate the bridging effect for a predetermined period of time. The conducting lines are detected to determine whether an undesired connection has occurred due to the bridging effect between the conducting lines.

12 Claims, 3 Drawing Sheets

METHOD OF DETECTING POTENTIAL BRIDGING EFFECTS BETWEEN CONDUCTING LINES IN AN INTEGRATED CIRCUIT

BACKGROUND

The present invention generally relates to testing integrated circuits, and more particularly to a method and system capable of detecting potential reliability failures of memory chips.

"Bridging effect" is a term describing the formation of an undesired electrical connection between adjacent conducting lines in an integrated circuit. One cause of the bridging effect is metal migration induced by a voltage difference between the adjacent lines. Such undesired connection often causes short circuits and system failures to the integrated circuit. As wire space of integrated circuits becomes narrower, the metal migration becomes easier and the bridging effect becomes more troublesome. For embodiment, a memory chip has a plurality of closely located word lines and bit lines defining addresses of memory cells. Conventionally, those word lines are composed of poly-silicon lines strapped with metal lines in order to reduce the RC effect. The strapped metal lines are particularly susceptible to the bridging effect because the metal migration may easily cross their narrow spacing. This may results in an undesired connection formed between the metal lines. Such undesired connection would cause unexpected voltage drop of signals on the word lines. As a result, the memory chip would not function property.

It is difficult to detect such bridging effect in the manufacturing stage. An integrated circuit would undergo a number of tests for purposes of quality control before it is released in the market. Conventionally, these tests input signals into the integrated circuit and check whether the output signals are correct. The signals are usually at an ordinary voltage level and lasts in the integrated circuit for a short period of time. However, the metal migration is a long and gradual process that usually takes a long time for the migrate metal to fully develop as an electrical connection. An integrated circuit that passes the tests may still fail later on because of the undesired connection developed over a long period of operation. This would increase the product return rate by the customers and raises a serious reliability issue.

What is needed is a method and system capable of detecting potential defects caused by the bridging effect between adjacent lines in order to improve the reliability of an integrated circuit.

SUMMARY

The invention comprises a method and system for detecting a potential reliability issue. A voltage difference is created between two conducting lines in the integrated for a predetermined period of time for inducing the bridging effect therebetween. The two conducting lines are detected to determine whether an undesired connection has occurred therebetween.

Various aspects and advantages will become apparent from the following detailed description, taken in conjunction with the accompanying drawings, illustrating the principles of the invention by way of embodiments.

DESCRIPTION

The invention presents a method and system for detecting potential reliability failures due to the bridging effect between two conducting lines in an integrated circuit. The two lines are electrically stressed to create a voltage difference for a predetermined period of time in order to accelerate the metal migration therebetween. An undesired connection between the stressed lines may occur as a result of the metal migration. A testing signal is inputted to one or both of the stressed lines. Whether the undesired connection occurs can be determined by detecting the output signal from the stressed lines. If the output signal fails to meet an expected standard, the undesired connection occurs. This means that the integrated circuit fails the reliability test.

The invention is applicable to any integrated circuit including, but not limited to, Programmable Read Only Memory (PROM), Erasable Programmable Read Only Memory (EPROM), Electrical Erasable Programmable Read Only Memory (EEPROM), Static Random Access Memory (SRAM), Dynamic Random Access Memory (DRAM), microprocessor, and other logic circuits. The invention will be described based on a non-volatile memory chip as one embodiment in the following paragraphs.

Figure 1:
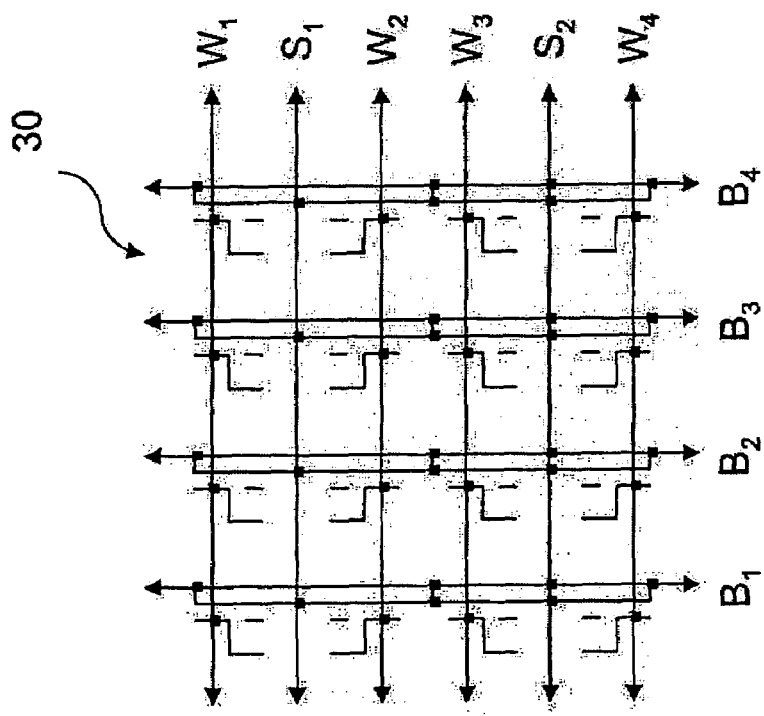
FIG. 1 illustrates a schematic of a conventional memory cell array.

FIG. 1 illustrates a memory cell array 30 having a plurality of memory cells arranged in rows and columns. A word line $W_1$, $W_2$, $W_3$ or $W_4$ runs through each row, and is connected to the control gates of the memory cells on that row. A bit line $B_1$, $B_2$, $B_3$ or $B_4$ runs through each column, and is connected to the drains of the memory cells on that column. A source line $S_1$ or $S_2$ is connected to the source of two adjacent memory cells. This arrangement enables the data stored in the memory array 30 to be read in a logical sense. For embodiment, when a reference voltage, $V_{ref}$, is applied to word line $W_1$, the control gates along word line $W_1$ will be turned on. The bit lines $B_1$, $B_2$, $B_3$ and $B_4$ will output binary data stored in the memory cells along word line $W_1$.

The word lines are usually made of conductive material, such as metal and silicon based materials (including poly silicon). Because the word lines are long and narrow, they suffer serious RC effects. The word lines are often strapped with a metal layer in order to reduce the resistance and alleviate the RC effect. Given that the scale of a memory chip is in the degree of subs meters or even lower, any two adjacent word lines would be very close to one another. The metal migration is relatively easy between the adjacent word lines. In other words, the word lines are particularly susceptible to the bridging effect. Because the bridging effect may not occur until the memory chip has been operated over a significant period of time, it is not easily detected in the manufacturing stage. In fact, such reliability problem is often found by an end user after he has run the memory chip for a long time. This may result in a high product return rate. As such, it is desirable to accelerate the metal migration in order to detect the bridging effect in the manufacturing stage.

The rate of metal migration between two adjacent word lines depends on the voltage difference therebetween. In order to create the voltage difference, one world line would be raised to a high voltage level, and the other adjacent word line would be maintained at a low voltage level. The greater the voltages difference, the higher the rate of metal migration. Because the happening of the bridging effect depends not only on the rate of metal migration, but also the time for which the metal migrates. A time would be predetermined for the adjacent word lines to undergo such voltage difference. The length of the predetermined time can be based upon the magnitude of the voltage difference and the requirement of reliability. If an undesired connection occurs between the word lines, they fail to meet the requirement of reliability.

Figure 2:
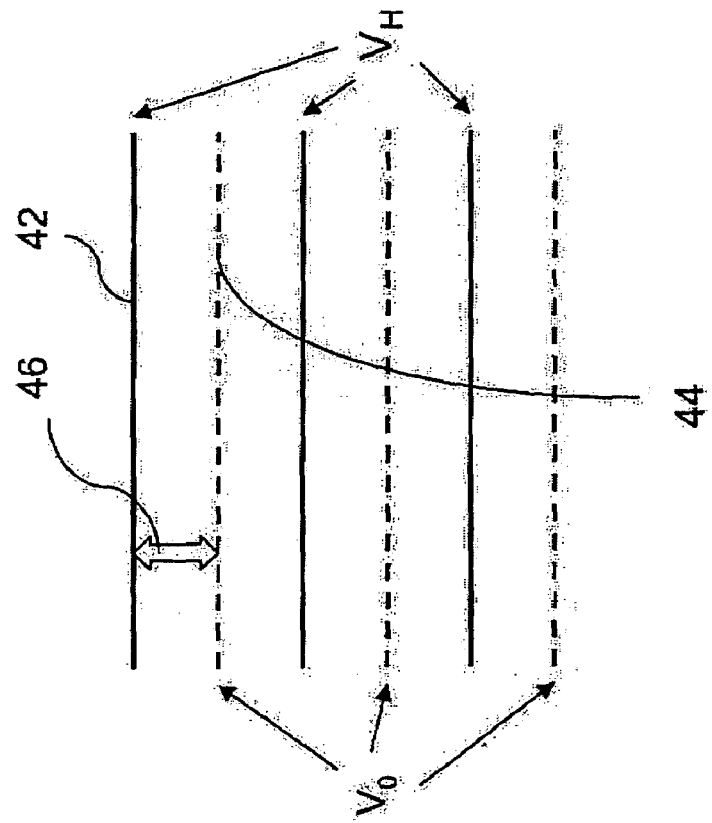
FIG. 2 illustrates a localized area of the memory cell undergoing a stress test according to an embodiment of the present invention.

FIG. 2 illustrates how to screen out an unreliable memory chip due to the bridging effect, according to an embodiment of the present invention. A memory chip include a plurality of word lines as shown in the figure. A high voltage ($V_H$) is applied to a word line 42 and an adjacent word line 44 is connected to a lower voltage level ($V_0$), such as ground. The voltage difference between the word lines 42 and 44 accelerates the metal migration therebetween. The voltage difference will be held for a predetermined period of time for the metal migration to form an undesired connection 46 therebetween. A signal is input into one or both of the word lines 42 and 44. Reading an output signal from the word lines 42 and 44, if the output signal's voltage drops, it means the undesired connection has occurred. This indicates that the memory chip fails the reliability requirement.

This embodiment applies not only to two individually selected word lines, but also to a group of word lines in a massive scale. A high voltage may be applied to alternating word lines. A low voltage may be applied to intervening word lines between the alternating word lines. Thus, those word lines can be tested together at one time.

Figure 3:
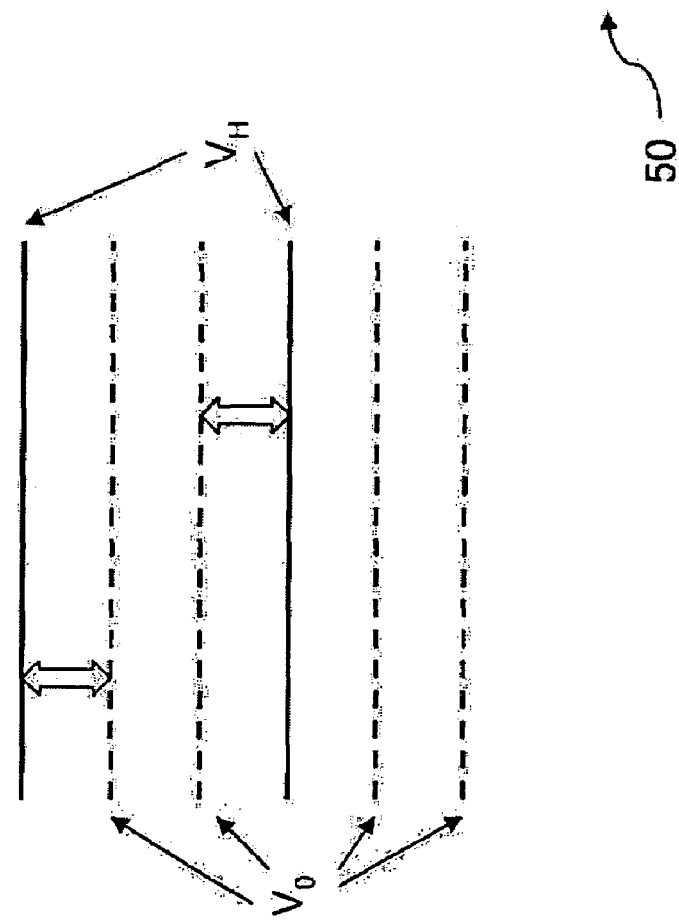
FIG. 3 illustrates another localized area of the memory cell undergoing the stress test according to an embodiment of the present invention.

There are alternative ways to detect a group of word lines according to the embodiment. Referring to FIG. 3, a high voltage ($V_H$) is applied to the first and fourth word lines for every four word lines. The second and third word lines of every four word lines are connected to a low voltage level, such as ground. While this alternative groups the word lines in a different way, the undesired connections caused by the bridging effect can be detected in the same manner as the above embodiment.

Note that the disclosed method can test any conductor other than word lines. The conductor may be metal or semiconductor based materials, such as poly-silicon. The migration of impurities in semiconductor materials works in a way similar to the metal migration. A voltage difference between two adjacent lines made of semiconductor materials accelerates the migration of impurities. This may also create an undesired connection caused by the bridging effect.

Figure 4:
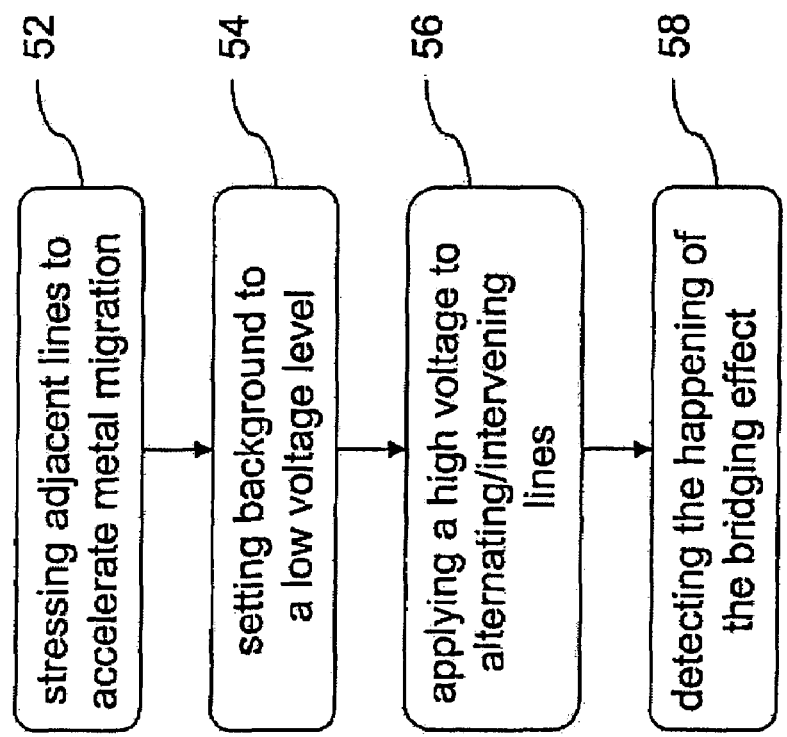
FIG. 4 is a flowchart illustrating a process for erasing a memory chip with the stress test according to an embodiment of the present invention.

FIG. 4 shows a flowchart 50 of using the disclosed method to test a memory chip in a memory erase process, according to one embodiment of the invention. At step 52, the memory chip is stressed to create a voltage difference between adjacent word lines to accelerate the metal migration. The way of creating such voltage difference is the same as the discussion above. At step 54, a background voltage of the word lines is set to a low voltage level. At step 56, a first high voltage is applied to alternating world lines to erase a first set of data associated thereto. Then a second high voltage is applied to intervening word lines that separate the alternating word lines to erase a second set of data associated thereto. For embodiment, a high voltage is applied to all of the odd word lines for a period of time, and then applied to all of the even word lines. The first high voltage may be the same as or differ from the first high voltage. Note that at least one or two intervening word lines can be arranged between two alternating word lines, as described in FIGS. 2 and 3. If there are any unreliable word lines, an undesired connection will occur during the stressing. The undesired connection will cause the high voltage drops inappropriately and results in the first and second sets of data erased incompletely and unsuccessfully. At step 58, the alternating and intervening conducting lines are detected to determine whether the first and second sets of data are fully erased, as an indication of the bridging effect's happening. For embodiment, the signals outputted from the conducting lined can be read to determine whether the data associated to those lines are erased. If the reading is not correct, it means that the erasure is not successful. This indicated that the undesired connection does occur and the memory chip fails the test.

As it is understood that the memory chip has its own inputs and outputs which allow the reading operation to happen. The voltage difference can be created by connecting the word lines to a power supply. Further, a detection or compensation circuit is traditionally included to erase the value of the data stored in the memory chip. These hardware modules can be used for the above described erasure and detection operations.

Conventionally, the reliability of a memory chip cannot be tested in an memory erasing process. One reason is that in the memory erasing process all of the word line are raised to a high voltage. As a result, there is no voltage difference between the adjacent word lines, so that the conventional memory erasing process does not accelerate the metal migration. As such, the disclosed memory erasing process has an advantage of detesting the bridging effect in the memory erasing process.

Figure 5:
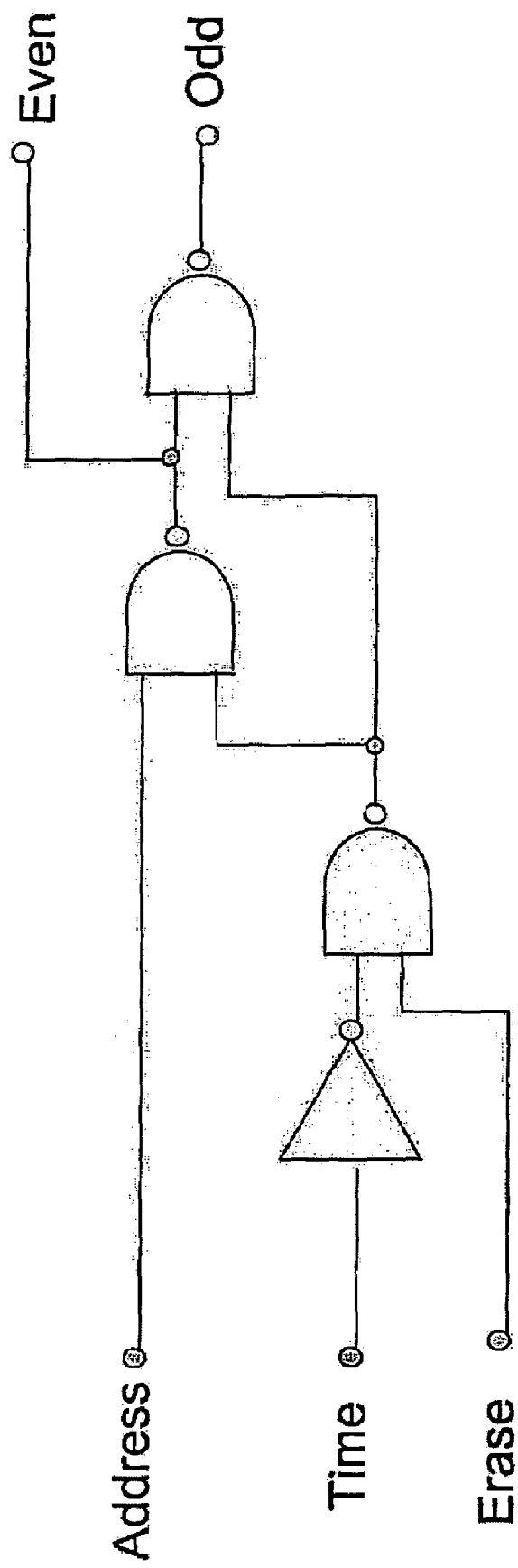
FIG. 5 illustrates an exemplary circuit for selecting alternating world lines for an erasure process according to an embodiment of the present invention.

FIG. 5 illustrates an exemplary selection circuit for selecting alternating lines for memory erasure. The circuit is composed of an inverter and three NAND gates. The truth table is presented as the following:

| Address | Time | Erase | Even Line | Odd Line |
| --- | --- | --- | --- | --- |
| 0 | 0 | 0 | 1 | 0 |
| 1 | 0 | 0 | 0 | 1 |
| 0 | 0 | 1 | 1 | 1 |
| 1 | 0 | 1 | 1 | 1 |
| 0 | 1 | 0 | 1 | 0 |
| 1 | 1 | 0 | 0 | 1 |
| 0 | 1 | 1 | 1 | 0 |
| 1 | 1 | 1 | 0 | 1 |

For embodiment, when the inputs at nodes, Address, Time and Erase are 0, 1 and 1, the output at the even line is 1 and the odd line is 0, wherein Address designates an address of an memory cell, Erase designates an activation of a erasure, and Time designates the time for the erasure. When the inputs at nodes, Address, Time and Erase are 1, 1 and 1, the output at the even line is 0 and at the odd line is 1.

Note that many other alternatives, either by hardware or software, can achieve the same result as the above selection circuit. The selection circuit may be an on-chip charge pump circuit, because this charge pump provides limited current and its level will be pull down if there is short to ground.

This invention makes it possible to screen out integrated circuits having potential reliability problems caused by the bridging before they are released to the end users. It can be used to detect the potential reliability failure between any conductive lines in any integrated circuit, such as Random Access Memory (RAM), PROM, EPROM, EEPROM, Flash Memory and Micro-Processor. The invention has a specific application to non-volatile memory, because it can be used together with a memory erasing process.

The above invention provides many different embodiments, or embodiments, for implementing different features of the invention. Specific embodiments of components, and processes are described to help clarify the invention. These are, of course, merely embodiments and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. A method for detecting a potential bridging effect between at least two of a plurality of conducting lines in an integrated circuit, the method comprising:
    applying a first voltage to a plurality of alternating conducting lines in the integrated circuit;
    applying a second voltage to a plurality of intervening conducting lines separating the alternating conducting lines, wherein the first voltage and the second voltage creates a voltage difference for inducing the bridging effect; and
    detecting whether an undesired connection has occurred due to the bridging effect between at least one such alternating conducting line and at least one such intervening conducting line; the detecting further comprising:
        setting all of the word lines to a low voltage level;
        applying a high voltage to the alternating word lines to erase a first set of data associated thereto;
            applying a high voltage to the intervening word lines to erase a second set of data associated thereto; and
        detecting detecting the bridging;
    wherein the integrated circuit is a memory chip;
    wherein the conducting lines are word lines in the memory chip.

2. The method of claim 1 wherein the conducting lines are arranged in an orderly, non-connected manner.

3. The method of claim 1 wherein at least one such intervening conducting line intervenes between two such alternating conducting lines.

4. The method of claim 1 wherein at least two such intervening conducting lines intervene between two such alternating conducting lines.

5. The method of claim 1 wherein the applying a high voltage further comprises providing one or more selection signals for selecting the alternating lines or the intervening lines responsive to inputs designating an address of an memory cell and an activation of a data erasure.

6. The method of claim 5 wherein the selection signals are responsive to an input designating a predetermined period of time for the data erasure.

7. An apparatus configured to detect a potential bridging effect between at least two of a plurality of conducting lines in an integrated circuit, the apparatus comprising:
    means for applying a first voltage to a plurality of alternating conducting lines in the integrated circuit;
    means for applying a second voltage to a plurality of intervening conducting lines separating the alternating conducting lines, wherein the first voltage and the second voltage creates a voltage difference for inducing the bridging effect; and
    means for detecting whether an undesired connection has occurred due to the bridging effect between at least one such alternating conducting line and at least one such intervening conducting line; the means for detecting further comprising:
        means for setting all of the word lines to a low voltage level;
        means for applying a high voltage to the alternating word lines to erase a first set of data associated thereto;
        means for applying a high voltage to the intervening word lines to erase a second set of data associated thereto; and
        means for detecting detecting the bridging;
    wherein the integrated circuit is a memory chip;
    wherein the conducting lines are word lines in the memory chip.

8. The apparatus of claim 7 wherein the conducting lines are arranged in an orderly, non-connected manner.

9. The apparatus of claim 7 wherein at least one such intervening conducting line intervenes between two such alternating conducting lines.

10. The apparatus of claim 7 wherein at least two such intervening conducting lines intervene between two such alternating conducting lines.

11. The apparatus of claim 7 wherein the means for applying a high voltage further comprises means for providing one or more selection signals for selecting the alternating lines or the intervening lines responsive to inputs designating an address of an memory cell and an activation of a data erasure.

12. The apparatus of claim 11 wherein the selection signals are responsive to an input designating a predetermined period of time for the data erasure.

* * * * *

UNITED STATES PATENT AND TRADEMARK OFFICE
CERTIFICATE OF CORRECTION

| | |
|---|---|
| PATENT NO. | : 7,053,647 B2 |
| APPLICATION NO. | : 10/841083 |
| DATED | : May 30, 2006 |
| INVENTOR(S) | : Yue-Der Chih and Ping-Chun Tai |

Page 1 of 1

It is certified that error appears in the above-identified patent and that said Letters Patent is hereby corrected as shown below:

Column 2, line 62, delete "subs meters" and insert therefore -- sub $\mu$ -- .

Column 5, line 46, delete "detecting detecting" and insert therefore -- detecting -- .

Signed and Sealed this

Sixth Day of November, 2007

JON W. DUDAS
*Director of the United States Patent and Trademark Office*